(12) United States Patent
Behzad (10) Patent No.: US 8,472,901 B2
(45) Date of Patent: Jun. 25, 2013

(54) GAIN CONTROL IN A MULTIPLE RF TRANSCEIVER INTEGRATED CIRCUIT

(75) Inventor: Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 512 days.

(21) Appl. No.: 12/780,631

(22) Filed: May 14, 2010

(65) Prior Publication Data

US 2010/0222011 A1  Sep. 2, 2010

Related U.S. Application Data

(63) Continuation of application No. 11/168,732, filed on Jun. 28, 2005, now Pat. No. 7,747,234.

(60) Provisional application No. 60/668,055, filed on Apr. 4, 2005.

(51) Int. Cl.
*H04B 17/02* (2006.01)

(52) U.S. Cl.
USPC ............. 455/136; 455/234.2; 455/247.1

(58) Field of Classification Search
USPC ............ 455/91–127.5, 136, 234.2, 247.1
See application file for complete search history.

(56) References Cited

U.S. PATENT DOCUMENTS

| 7,058,364 B2 * | 6/2006 | Atkinson et al. | 455/76 |
| 7,599,667 B2 * | 10/2009 | Arai | 455/78 |
| 7,747,234 B2 * | 6/2010 | Behzad | 455/136 |

* cited by examiner

*Primary Examiner* — Christian Hannon
(74) *Attorney, Agent, or Firm* — Garlick & Markison; Holly L. Rudnick (57) ABSTRACT

A radio frequency (RF) transceiver integrated circuit (IC) includes a plurality of baseband Tx sections, a plurality of RF Tx sections, a plurality of RF Rx sections, and a plurality of baseband Rx sections. The RF transceiver IC further includes a static digital interface, a dynamic digital interface, and gain control, distribution, and buffering circuitry. Static digital interfaces are operable to receive static gain control commands from a coupled baseband processor. The dynamic digital interface is also operable to receive dynamic gain control commands from the coupled baseband processor. The gain control, distribution, and buffering circuitry is operable to apply the static gain control commands and dynamic gain control commands to at least some of the plurality of baseband Tx sections, the plurality of RF Tx sections, the plurality of RF Rx sections, and the plurality of baseband Rx sections.

21 Claims, 8 Drawing Sheets

GAIN CONTROL IN A MULTIPLE RF TRANSCEIVER INTEGRATED CIRCUIT

CROSS REFERENCES TO RELATED APPLICATIONS

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility application Ser. No. 11/168,732, entitled "Gain control in a multiple RF transceiver integrated circuit," filed Jun. 28, 2005, pending, which claims priority pursuant to 35 U.S.C. §119(e) to the following U.S. Provisional Patent Application which is hereby incorporated herein by reference in its entirety and made part of the present U.S. Utility Patent Application for all purposes:

U.S. Provisional Application Ser. No. 60/668,055, entitled "Gain control in a multiple RF transceiver integrated circuit," filed Apr. 4, 2005.

Additionally, this Application is related to application Ser. No. 11/132,777 entitled "Gain estimation for multiple receiver systems," filed May 19, 2005, for inventors R. Tushar Moorti, Rohit V. Gaikwad, and Amit G. Bagchi, and claims priority to U.S. Provisional Application No. 60/668,055 filed Apr. 4, 2005, both of which are incorporated herein by reference for all purposes.

BACKGROUND OF THE INVENTION

1. Field of the Invention

This invention generally relates to wireless communications and more particularly to Radio Frequency transceivers.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio frequency transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Typically, the transmitter will include one antenna for transmitting the RF signals, which are received by a single antenna, or multiple antennas, of a receiver. When the receiver includes two or more antennas, the receiver will select one of them to receive the incoming RF signals. In this instance, the wireless communication between the transmitter and receiver is a single-output-single-input (SISO) communication, even if the receiver includes multiple antennas that are used as diversity antennas (i.e., selecting one of them to receive the incoming RF signals). For SISO wireless communications, a transceiver includes one transmitter and one receiver. Currently, most wireless local area networks (WLAN) that are IEEE 802.11, 802.11a, 802,11b or 802.11g employ SISO wireless communications.

Other types of wireless communications include single-input-multiple-output (SIMO), multiple-input-single-output (MISO), and multiple-input-multiple-output (MIMO). In a SIMO wireless communication, a single transmitter processes data into radio frequency signals that are transmitted to a receiver. The receiver includes two or more antennas and two or more receiver paths. Each of the antennas receives the RF signals and provides them to a corresponding receiver path (e.g., LNA, down conversion module, filters, and ADCs). Each of the receiver paths processes the received RF signals to produce digital signals, which are combined and then processed to recapture the transmitted data.

For a multiple-input-single-output (MISO) wireless communication, the transmitter includes two or more transmission paths (e.g., digital to analog converter, filters, up-conversion module, and a power amplifier) that each converts a corresponding portion of baseband signals into RF signals, which are transmitted via corresponding antennas to a receiver. The receiver includes a single receiver path that receives the multiple RF signals from the transmitter. In this instance, the receiver uses beam forming to combine the multiple RF signals into one signal for processing.

For a multiple-input-multiple-output (MIMO) wireless communication, the transmitter and receiver each include multiple paths. In such a communication, the transmitter parallel processes data using a spatial and time encoding function to produce two or more streams of data. The transmitter includes multiple transmission paths to convert each stream of data into multiple RF signals. The receiver receives the multiple RF signals via multiple receiver paths that recapture the streams of data utilizing a spatial and time decoding function. The recaptured streams of data are combined and subsequently processed to recover the original data.

One problem associated with MIMO wireless communications deals with the differing power levels associated with the diverse paths. For example, within a SISO communication system, diversity antennas may be selected to improve the power level associated with the received signal. In a SISO wireless communication system, the antenna may be selected based on the received power level. Within a MIMO system using single or multiple antennas, the differing signal paths may result in differing power levels associated with the multiple received communications.

Additionally, it would be desirable to use one or more types of wireless communications (e.g., SISO, MISO, SIMO, and MIMO), to enhance data throughput within a WLAN. For example, high data rates can be achieved with MIMO communications in comparison to SISO communications. However, the differing power levels on the multiple received communications must be addressed in order to effectively use this technology to achieve enhanced data rates.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
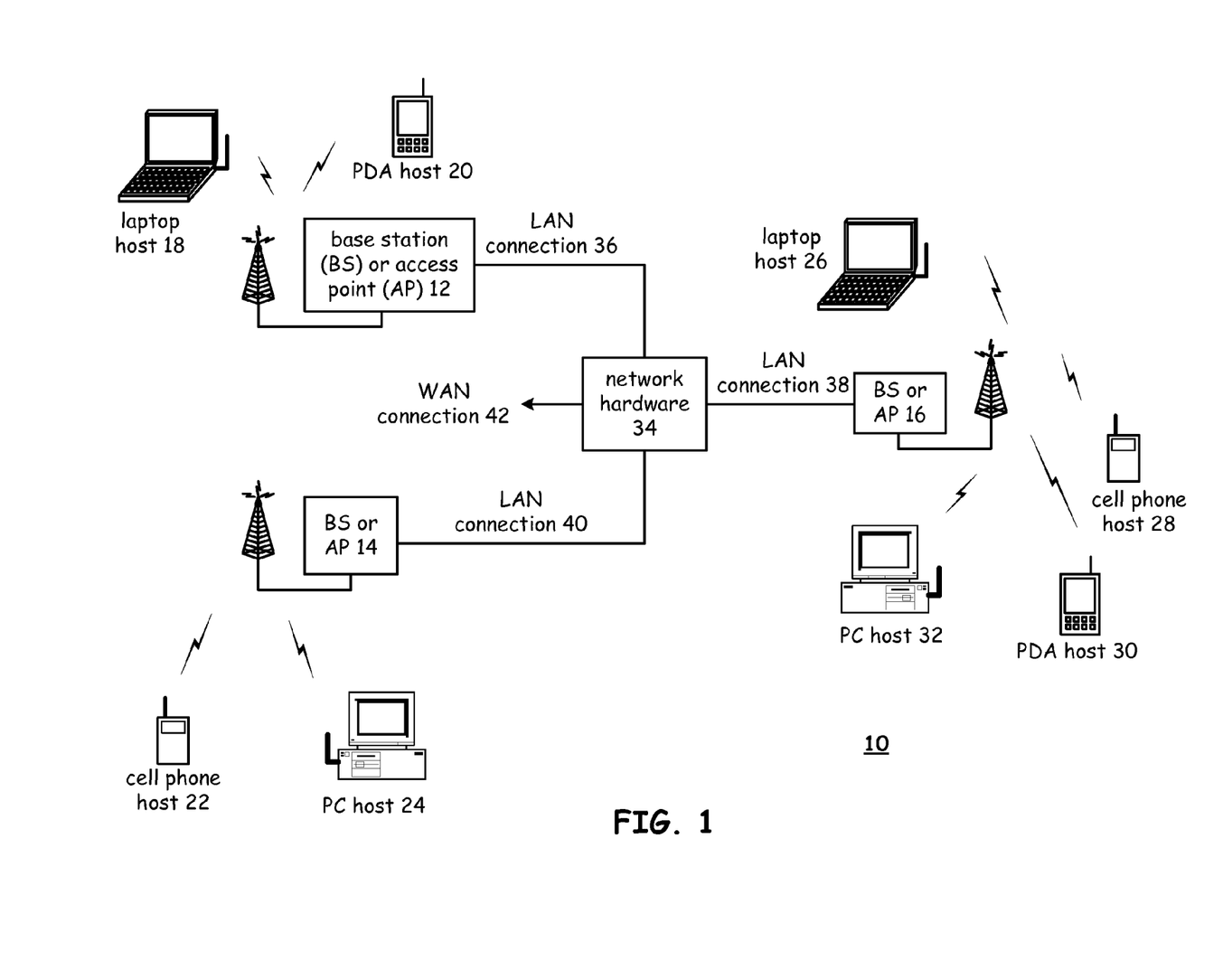
FIG. 1 is a schematic block diagram of a wireless communication system in accordance with some embodiments of the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32, and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera, provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
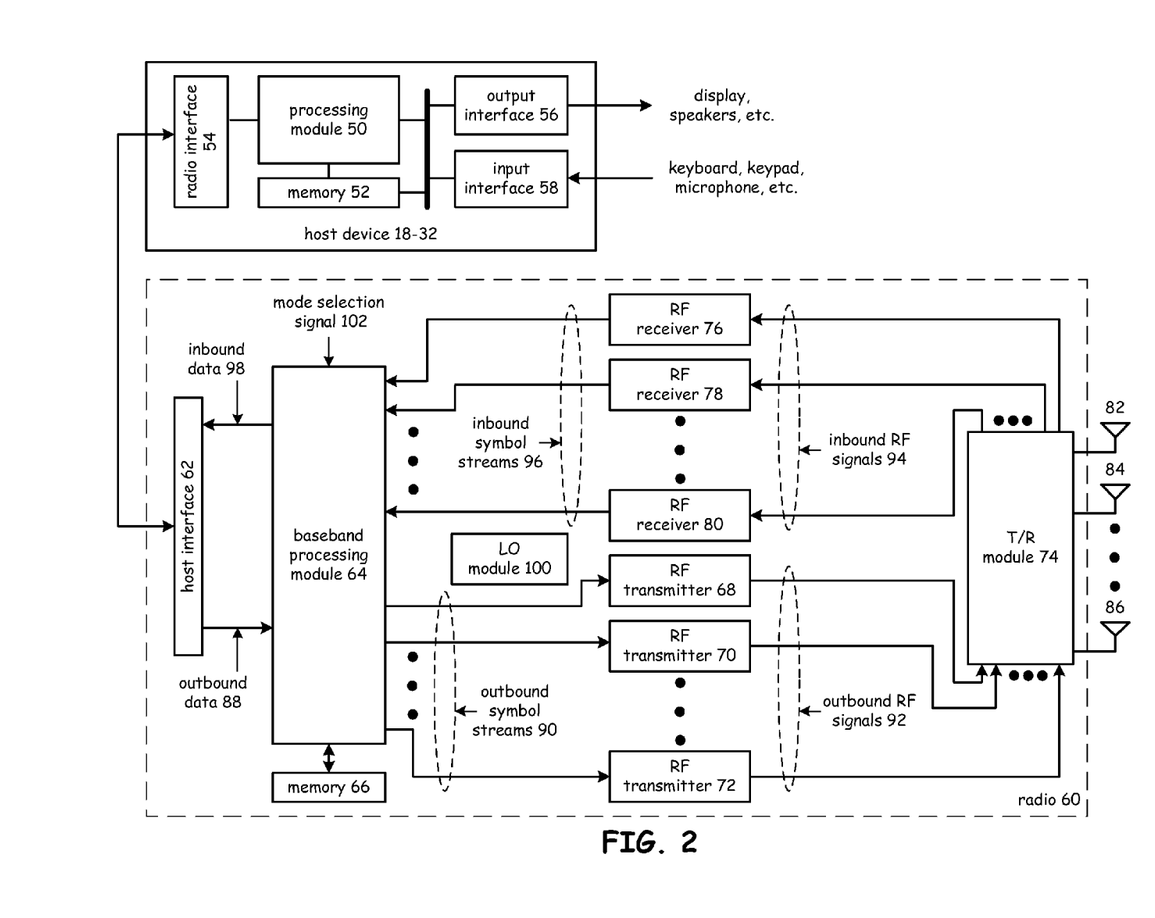
FIG. 2 is a schematic block diagram of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58, and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 64, memory 66, a plurality of radio frequency (RF) transmitters 68-72, a transmit/receive (T/R) module 74, a plurality of antennas 82-86, a plurality of RF receivers 76-80, and a local oscillation module 100. The baseband processing module 64, in combination with operational instructions stored in memory 66, execute digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space, and time decoding, and/or descrambling. The digital transmitter functions include, but are not limited to, scrambling, encoding, interleaving, constellation mapping, modulation, inverse fast Fourier transform, cyclic prefix addition, space and time encoding, and/or digital baseband to IF conversion. The baseband processing module 64, also referred to herein as a baseband processor, may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 66 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 88 from the host device via the host interface 62. The baseband processing module 64 receives the outbound data 88 and, based on a mode selection signal 102, produces one or more outbound symbol streams 90. The mode selection signal 102 will indicate a particular mode. For example, the mode selection signal 102 may indicate a specific frequency band, channel bandwidth, and maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM, and/or 64 QAM. A code rate is supplied as well as number of coded bits per subcarrier (NBPSC), coded bits per OFDM symbol (NCBPS), data bits per OFDM symbol (NDBPS), error vector magnitude in decibels (EVM), sensitivity which indicates the maximum receive power required to obtain a target packet error rate (e.g., 10% for IEEE 802.11a), adjacent channel rejection (ACR), and an alternate adjacent channel rejection (AACR).

The mode selection signal may also indicate a particular channelization for the corresponding mode. The mode select signal may further indicate a power spectral density mask value. The mode select signal may alternatively indicate rates for alternative frequency bands, channel bandwidth, and a maximum bit rate. A number of antennas may be utilized to achieve the higher bandwidths. In such an instance, the mode select would further indicate the number of antennas to be utilized.

The baseband processing module 64, based on the mode selection signal 102 produces the one or more outbound symbol streams 90 from the output data 88. For example, if the mode selection signal 102 indicates that a single transmit antenna is being utilized for the particular mode that has been selected, the baseband processing module 64 will produce a single outbound symbol stream 90. Alternatively, if the mode select signal indicates 2, 3, or 4 antennas, the baseband processing module 64 will produce 2, 3, or 4 outbound symbol streams 90 corresponding to the number of antennas from the output data 88.

Depending on the number of outbound streams 90 produced by the baseband module 64, a corresponding number of the RF transmitters 68-72 will be enabled to convert the outbound symbol streams 90 into outbound RF signals 92. The implementation of the RF transmitters 68-72 will be further described with reference to FIG. 3. The transmit/receive module 74 receives the outbound RF signals 92 and provides each outbound RF signal to a corresponding antenna 82-86.

When the radio 60 is in the receive mode, the transmit/receive module 74 receives one or more inbound RF signals via the antennas 82-86. The T/R module 74 provides the inbound RF signals 94 to one or more RF receivers 76-80. The RF receiver 76-80, which will be described in greater detail with reference to FIG. 4, converts the inbound RF signals 94 into a corresponding number of inbound symbol streams 96. The number of inbound symbol streams 96 will correspond to the particular mode in which the data was received. The baseband processing module 60 receives the inbound symbol streams 90 and converts them into inbound data 98, which is provided to the host device 18-32 via the host interface 62.

As one of average skill in the art will appreciate, the wireless communication device of FIG. 2 may be implemented using one or more integrated circuits. For example, the host device may be implemented on one integrated circuit, the baseband processing module 64 and memory 66 may be implemented on a second integrated circuit, and the remaining components of the radio 60, less the antennas 82-86, may be implemented on a third integrated circuit. As an alternate example, the radio 60 may be implemented on a single integrated circuit. As yet another example, the processing module 50 of the host device and the baseband processing module 64 may be a common processing device implemented on a single integrated circuit. Further, the memory 52 and memory 66 may be implemented on a single integrated circuit and/or on the same integrated circuit as the common processing modules of processing module 50 and the baseband processing module 64.

Figure 3:
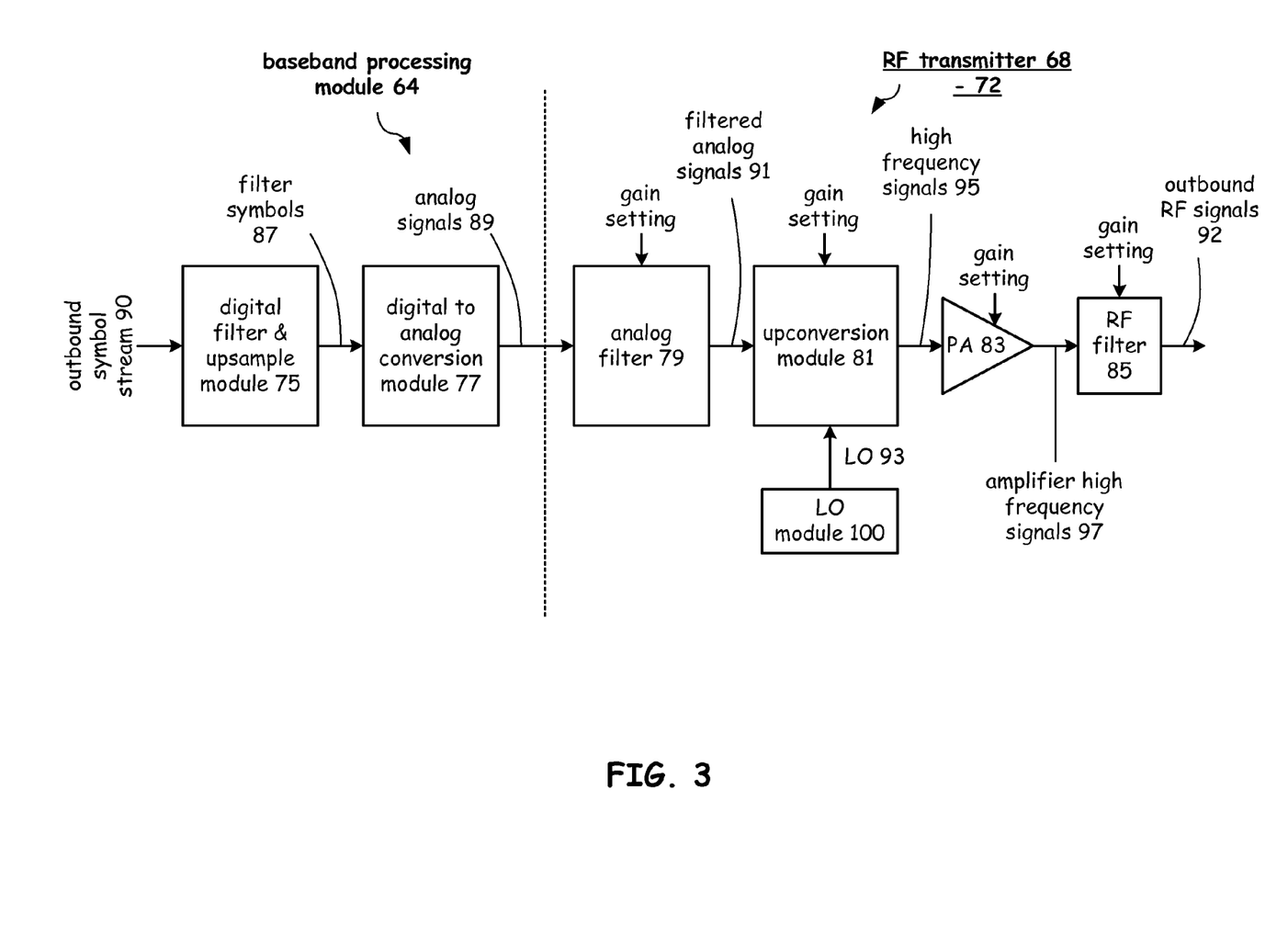
FIG. 3 is a schematic block diagram illustrating some components of an RF transmitter in accordance with an embodiment of the present invention.

FIG. 3 is a schematic block diagram illustrating some components of an RF transmitter 68-72 in accordance with an embodiment of the present invention. The RF transmitter 68-72 includes a digital filter and up-sampling module 75, a digital-to-analog conversion module 77, an analog filter 79, and up-conversion module 81, a power amplifier 83 and a RF filter 85. The digital filter and up-sampling module 75 receives one of the outbound symbol streams 90 and digitally filters it and then up-samples the rate of the symbol streams to a desired rate to produce the filtered symbol streams 87. The digital-to-analog conversion module 77 converts the filtered symbols 87 into analog signals 89. The analog signals may include an in-phase component and a quadrature component.

The analog filter 79 filters the analog signals 89 to produce filtered analog signals 91. The up-conversion module 81, which may include a pair of mixers and a filter, mixes the filtered analog signals 91 with a local oscillation 93, which is produced by local oscillation module 100, to produce high frequency signals 95. The frequency of the high frequency signals 95 corresponds to the frequency of the RF signals 92.

The power amplifier 83 amplifies the high frequency signals 95 to produce amplified high frequency signals 97. The RF filter 85, which may be a high frequency band-pass filter, filters the amplified high frequency signals 97 to produce the desired output RF signals 92.

As one of average skill in the art will appreciate, each of the radio frequency transmitters 68-72 will include a similar architecture as illustrated in FIG. 3 and further include a shut-down mechanism such that when the particular radio frequency transmitter is not required, it is disabled in such a manner that it does not produce interfering signals and/or noise.

Each of the RF elements, analog filter 79, upconversion module 81, power amplifier 83, and RF filter 85 does/may have a controllable adjustable gain. The gain of these elements 79, 81, 83, and 85 may be adjustable by a respective gain setting. As the reader will appreciate, some or all of these elements 79, 81, 83, and 85 may be gain adjustable elements. Further, other RF transmitter structures may have more, fewer, or differing elements that are gain adjustable. As will be described further with reference to FIGS. 5-8, according to embodiments of the present invention, the gain settings corresponding to these gain adjustable elements 79, 81, 83, and 85 may be individually or jointly controlled. Further, multiple of the RF transmitters 68-72 may have their gain settings jointly controlled by one or more gain control commands.

In some embodiments, the RF filter 85 may be located "off chip," in which case it may not have gain control. Further, the analog filter may not have a controllable gain in some embodiments. Further, the reader should understand that the term "gain" includes levels of gain greater than one (greater than 0 dB) and less than one (less than 0 dB). Thus, while some of the controllable gain elements of FIG. 3 may have a gain greater than one, other of the elements may have unity gain or gain that is less than one.

Figure 4:
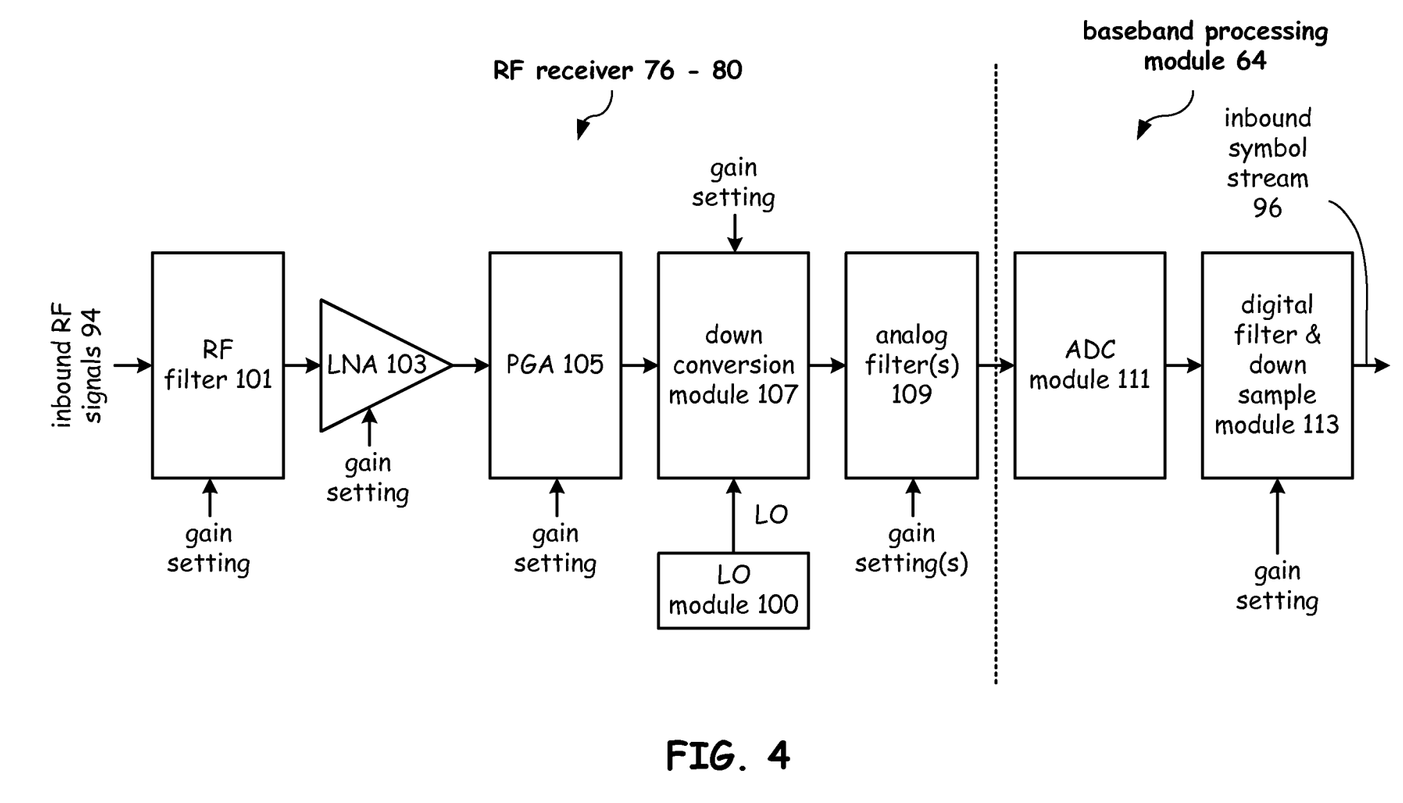
FIG. 4 is a schematic block diagram illustrating some components of an RF receiver in accordance with an embodiment of the present invention.

FIG. 4 is a schematic block diagram illustrating some components of an RF receiver 76-80 in accordance with an embodiment of the present invention. In this embodiment, each of the RF receivers 76-80 includes an RF filter 101, a low noise amplifier (LNA) 103, a programmable gain amplifier (PGA) 105, a down-conversion module 107, an analog filter 109, an analog-to-digital conversion (ADC) module 111, and a digital filter and down-sampling module 113. The RF filter 101, which may be a high frequency band-pass filter, receives the inbound RF signals 94 and filters them to produce filtered inbound RF signals. The low noise amplifier 103 amplifies the filtered inbound RF signals 94 based on a gain setting and provides the amplified signals to the programmable gain amplifier 105. The programmable gain amplifier further amplifies the inbound RF signals 94 before providing them to the down-conversion module 107.

Each of the RF elements, the RF filter 101, the LNA 103, the PGA 105, the down-conversion module 107, and the analog filter 109 does/may have a controllable adjustable gain. The gain of these elements 101, 103, 105, 107, and 109 may be adjustable by a respective gain setting. As the reader will appreciate, some or all of these elements 101, 103, 105, 107, and 109 may be gain adjustable elements. Further, other RF receiver structures may have more, fewer, or differing elements that are gain adjustable. As will be described further with reference to FIGS. 5-8, according to embodiments of the present invention, the gain settings corresponding to these gain adjustable elements 101, 103, 105, 107, and 109 may be individually or jointly controlled. Further, multiple of the RF receivers 76-80 may have their gain settings jointly controlled by one or more gain control commands.

In some embodiments, the RF filter 101 resides "off-chip." In such case, the RF filter 101 may or may not have a controllable gain. Further, in some embodiments, the PGA 105 may not be present. Moreover, the analog filter(s) 109 may include one or more separate filters and one or more separate amplifiers.

Figure 5:
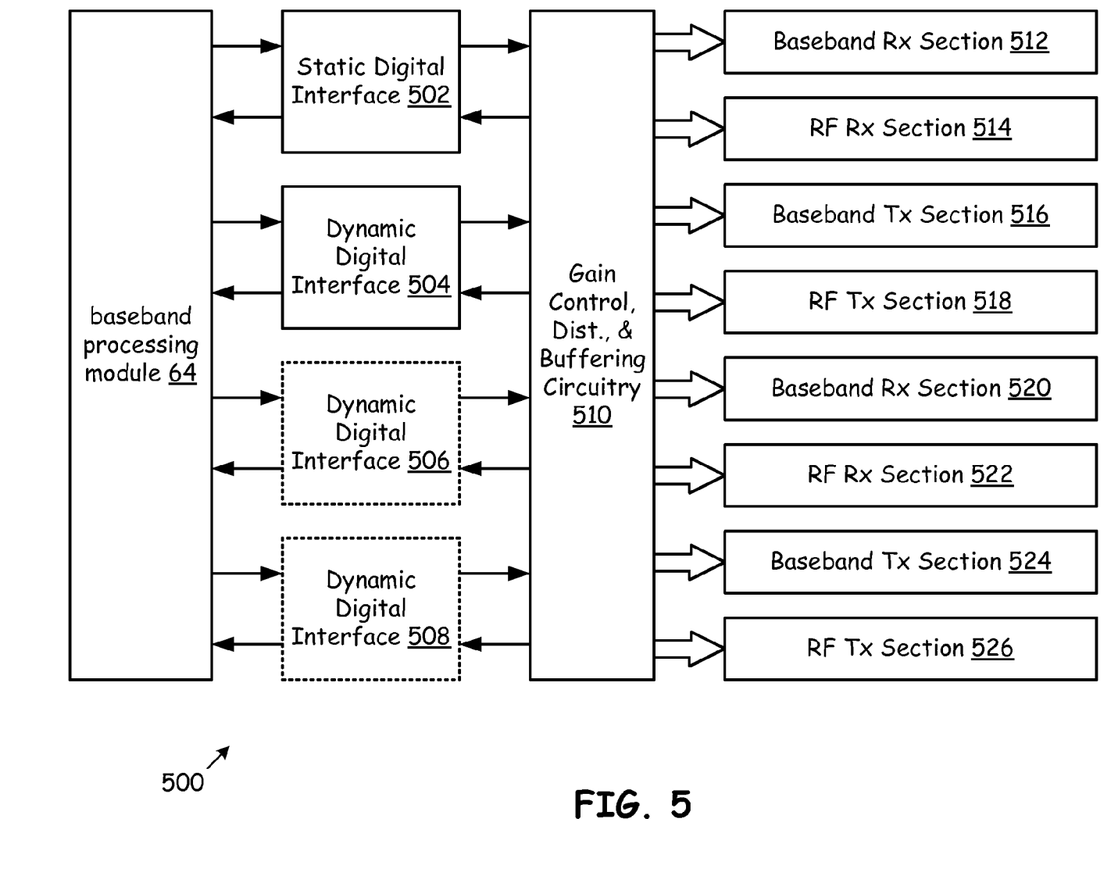
FIG. 5 is a schematic block diagram illustrating a portion of an RF transceiver Integrated Circuit (IC) according to an embodiment of the present invention.

FIG. 5 is a schematic block diagram illustrating a portion of an RF transceiver Integrated Circuit (IC) according to an embodiment of the present invention. The portion of the RF transceiver IC 500 of FIG. 5 includes a plurality of baseband Tx sections 516 and 524, a plurality of RF Tx sections 518 and 526, a plurality of RF Rx sections 514 and 522, and a plurality of baseband Rx section 512 and 522. The number of sections 512-526 illustrated in FIG. 5 is for illustrative purposes only and the principles of the present invention may be extended to any number of sections exceeding two.

Each Rx Tx section 518 and 526 is operable to receive, filter, gain adjust, and up convert a respective Tx baseband signal to produce a respective Tx RF signal. Each of the plurality of RF Rx sections 514 and 522 is operable to receive, filter, gain adjust, and down convert a respective RF Rx signal to produce a respective Rx baseband signal. Each of the plurality of baseband Rx sections 512 and 520 is operable to receive, filter, and gain adjust a respective Rx baseband signal. Finally, each of the plurality of baseband Tx sections 516 and 524 is operable to receive, filter, and gain adjust a respective Tx baseband signal. The structure of the baseband Tx sections 516 and 524 as well as the plurality of RF Tx sections 518 and 526 was illustrated in detail with reference to FIG. 3. Further, the structure of the plurality of RF Rx sections 512 and 520 and the plurality of baseband Rx sections 512 and 520 was illustrated in detail with reference to FIG. 3.

The RF transceiver IC 500 further includes a static digital interface 502 and one or more dynamic digital interfaces 504, 506, and/or 508. Each of the static digital interface 502 and the dynamic digital interfaces 504, 506, and 508 communicatively couples to gain control distribution, control and buffering circuitry 510 and to baseband processing module (baseband processor) 64. One particular structure of the static digital interface 502 and the dynamic digital interfaces 504-508 will be described further with reference to FIG. 8. The reader should appreciate that according to the principles of the embodiment of the present invention of FIG. 5, only a single static digital interface 502 and a single dynamic digital interface 504 are required.

The static digital interface 502 is operable to receive static gain control commands from the coupled baseband processor 64. Further, the dynamic digital interfaces 504, 506, and/or 508 are operable to receive dynamic gain control commands from the coupled baseband processor 64. Finally, the gain control distribution, control, and buffering circuitry 510 is operable to apply the static gain control commands and dynamic gain control commands to at least some of the plurality of baseband Tx sections 516 and 524, the plurality of RF Tx sections 518 and 526, the plurality of RF Rx sections 512 and 520, and the plurality of baseband Rx sections 512 and 520.

According to one aspect of the RF transceiver IC 500, the static gain control commands correspond to static gain settings enacted over multiple RF frame cycles. Further, with this embodiment, the dynamic gain control commands correspond to dynamic gain settings enacted over respective individual RF cycles. Further detail regarding this embodiment will be described further with reference to FIG. 7. According to another aspect of the RF transceiver IC 500 of FIG. 5, the static gain control commands correspond to static gain settings enacted during calibration operations while the dynamic gain control commands correspond to dynamic gain settings enacted based upon RF frame cycle operations. According to a still further aspect of the present invention, based upon the static gain control commands, the gain control, distribution, and buffering circuitry 510 is operable to disable dynamic gain control commands during calibration of the RF transceiver IC 500. In one particular example that will be described further with reference to FIG. 7, the RF transceiver IC 500 enters calibration operations periodically, at start-up, or at reset. During such calibration operations, the baseband processing module 64 interact with the gain control, distribution, and buffering circuitry 510 to perform initial calibration for the sections 512-526. Thus, during this calibration setting, the dynamic gain control commands are advantageously disabled.

According still a further aspect of the present invention, the static gain control command comprises a multiple section selection command to select multiple sections of the sections 512-526. The gain control, distribution, and buffering circuitry is operable to apply one dynamic gain control command to the multiple selected sections. For example, when the RF transceiver IC 500 supports MIMO operations, it may be advantageous to apply consistent gain control commands to all baseband Tx sections 516 and 524. In such case, the static gain control command would direct the gain control, distribution, and buffering circuitry 510 to uniformly apply a dynamic gain control command to these sections. As another example, some dynamic gain control commands would be applied to both baseband Rx sections 512 and 520 and RF Rx sections 514 and 522. In such case, the multiple section selection command would select each of the sections 502, 514, 520, and 522 for subsequent consistent application of one or more dynamic gain control commands.

According to yet another aspect of the present invention, the dynamic gain control command may include both a section selection command and a section gain control command. In such case, the gain control, distribution, and buffering circuitry is operable to select one of the plurality of sections 512-526 based upon the section selection command. Then, the gain control, distribution, and buffering circuitry 510 is operable to adjust the gain of at least one adjustable gain element of the selected section based upon the section gain control command to the selected section.

According to still another aspect of the present invention, the dynamic gain control commands may include a section selection command, an element selection command, and an element gain control command. In such case, the section selection command is employed by the gain control, distribution, and buffering circuitry 510 to select one of the plurality of section 512-526. Further, the element selection command is employed by the gain control, distribution, and buffering circuitry 512 to select one or more adjustable gain elements of the selected section(s). Finally, the gain control, distribution, and buffering circuitry is operable to adjust the gain of the selected adjustable gain element of the selected section based upon the element gain control command.

Figure 6:
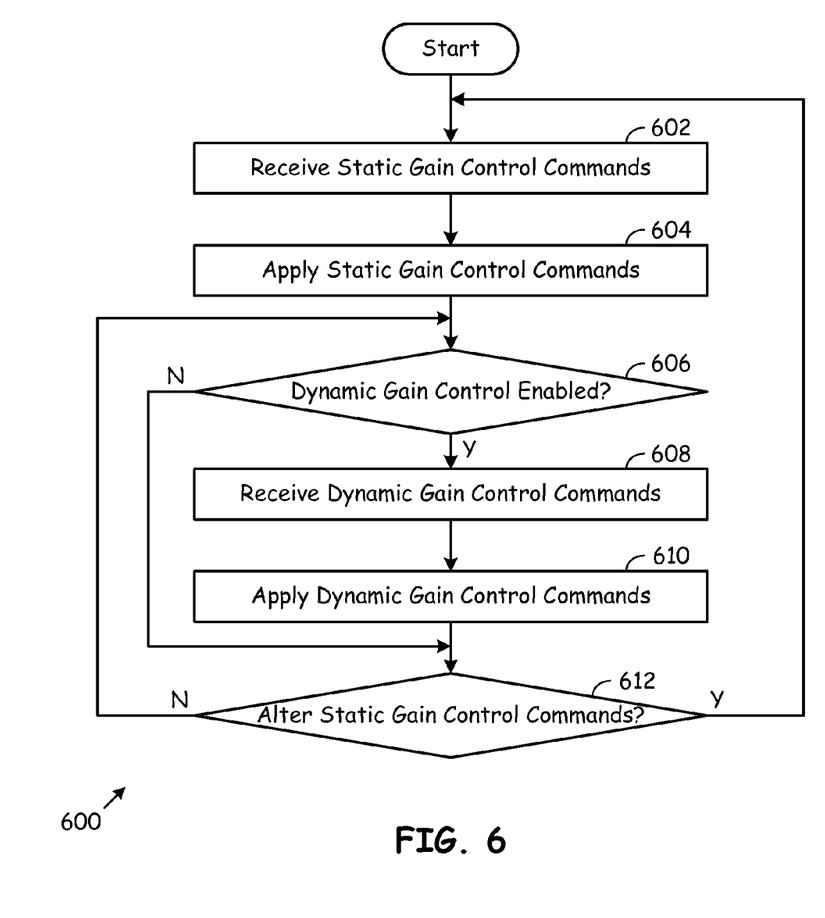
FIG. 6 is a flow chart illustrating operation of the RF transceiver IC of FIG. 5 according to some embodiments of the present invention.

FIG. 6 is a flow chart illustrating operation of the RF transceiver IC of FIG. 5 according to some embodiments of the present invention. The operations 600 of FIG. 6 may be applied to an RF transceiver IC having a plurality of baseband Tx sections, a plurality of RF Tx sections, a plurality of baseband Rx sections, and a plurality of RF Rx sections. Operation commences with the RF transceiver IC receiving static gain control commands via a static digital interface from a coupled baseband processor (Step 602). Operation continues with the RF transceiver IC implementing the static gain control commands that were received from the coupled baseband processor (Step 604). Next, the RF transceiver IC (gain control, distribution, and buffering circuitry) determines whether dynamic gain control is enabled (Step 606). If dynamic gain control is enabled, as determined at Step 606, the RF transceiver IC receives dynamic gain control commands via one or more dynamic digital interfaces from the coupled baseband processor (Step 608). The RF transceiver IC then applies the dynamic gain control commands to at least some gain adjustable elements of the plurality of baseband Tx sections, the plurality of RF Tx sections, the plurality of RF Rx sections, and the plurality of baseband Rx sections (Step 610).

Then, the RF transceiver IC determines whether to alter the static gain control commands (Step 612). A requirement to alter the static gain control commands would typically come from the coupled baseband processor via the static digital interface. However, a direction to alter the static gain control commands may also come from the coupled baseband processor via the dynamic digital interface or may be generated internally by the gain control, distribution, and buffering circuitry of the RF transceiver IC.

When the dynamic gain control is disabled, as determined at Step 606, operation proceeds from Step 606 to Step 612. In such case, as may be implemented during calibration or test operations of the RF transceiver IC, the input at the dynamic digital interface would be ignored. When alteration of the static gain control command as determined at Step 612 is not required, operation proceeds from Step 612 back to Step 606. As will be described further with reference to FIG. 7, the static gain control commands may be enacted over multiple RF frame cycles while the dynamic gain control commands may be enacted over respective individual RF frame cycles. Further, applying the static gain control commands may include selecting multiple sections of the RF transceiver IC for application. In such case, with multiple sections selected, the dynamic gain control command may be applied to each of the selected sections. Further, the dynamic gain control command may include selecting one section of the plurality of sections and in applying the dynamic gain control command to the one selected section. Further, the dynamic gain control command may select one section of the plurality of sections, to select one or more gain adjustable elements of the selected section, and to adjust the gain of the selected gain adjustable element or elements of the selected section.

According to some embodiments of the present invention, the static gain control commands are received in a serial fashion while the dynamic gain control settings are received in a parallel fashion. The manner in which such receipt of gain control settings occur are described further with reference to FIG. 8. Further, the static gain control commands received at step 602 may be received only at startup or reset with the dynamic gain control commands received during normal operations.

Figure 7:
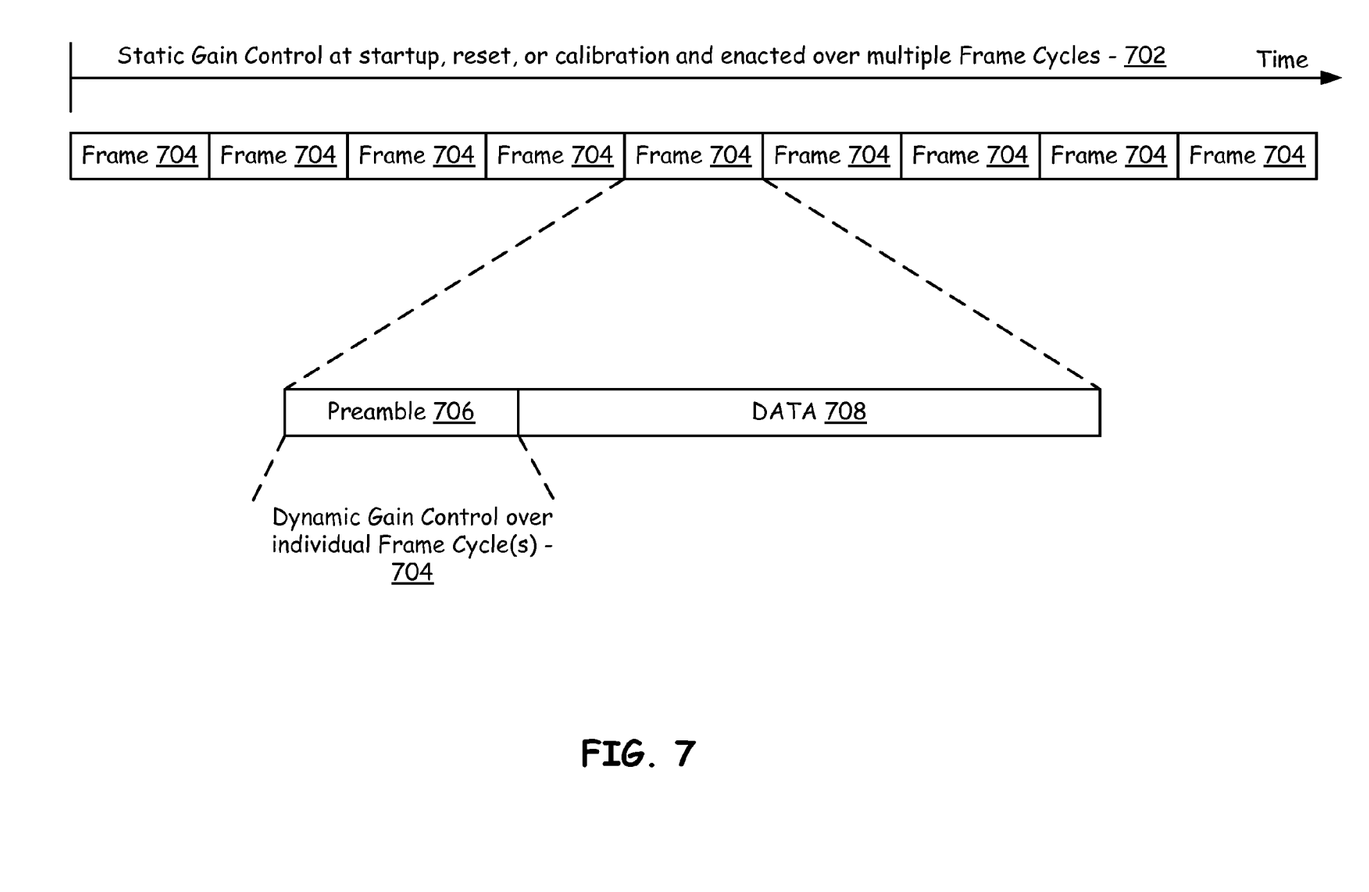
FIG. 7 is a diagram illustrating the basic structure of RF frames and how gain control operates based there upon according to an embodiment of the present invention.

FIG. 7 is a diagram illustrating the basic structure of RF frames and how gain control operates based there upon according to an embodiment of the present invention. Shown in FIG. 7 are a plurality of frames 704, each of which occupies a frame cycle. As is shown, a static gain control command is enacted over multiple frame cycles 702. Each frame 704 may carry a portion of a data packet, all of a data packet, or multiple data packets, e.g., link layer packets, MAC layer packets, IP packets, etc. In such case, the static gain control settings are determined at startup, reset and/or during calibration operations and then enacted over the multiple frame cycles 702. The dynamic gain control settings may be determined and applied on a partial packet by partial packet basis, a frame by frame basis, and/or a multiple frame by multiple frame bases.

The static gain control commands may be applied to multiple sections of an RF transceiver IC that supports MIMO operations. When the RF transceiver IC supports MIMO operations, it may be determined that consistent gain settings for multiple sections, e.g., baseband Rx sections 512 and 520 and/or RF Rx sections 514 and 522, over multiple frame cycles 702 is advantageous. In this case, the static gain control settings may be applied to multiple of these sections over multiple frame cycle 702 resulting in the consistent application of gain control settings for these multiple sections of the RF transceiver IC. Further, each of these sections may employ differing or the same dynamic gain control settings.

Alternatively, it may be advantageous for each section to have some of its gain adjustable elements to be independently gain controlled for each RF frame 704. In such case, some of the gain adjustable elements of the sections may have their gain settings fixed for the multiple frame cycle 702 while other of the gain adjustable elements may have dynamic gain control over individual frame cycles 704. This further teaching is illustrated in FIG. 7 to show that during preamble 706 of frame 704, dynamic gain control occurs. As is further shown, the gain control settings are enacted during the data 708 portion of the RF frame 704. Thus, the RF transceiver IC in this operation according to the present invention provides significant flexibility and efficiency when considering the control of gain adjustable elements of multiple sections over multiple RF frame cycles 702.

Figure 8:
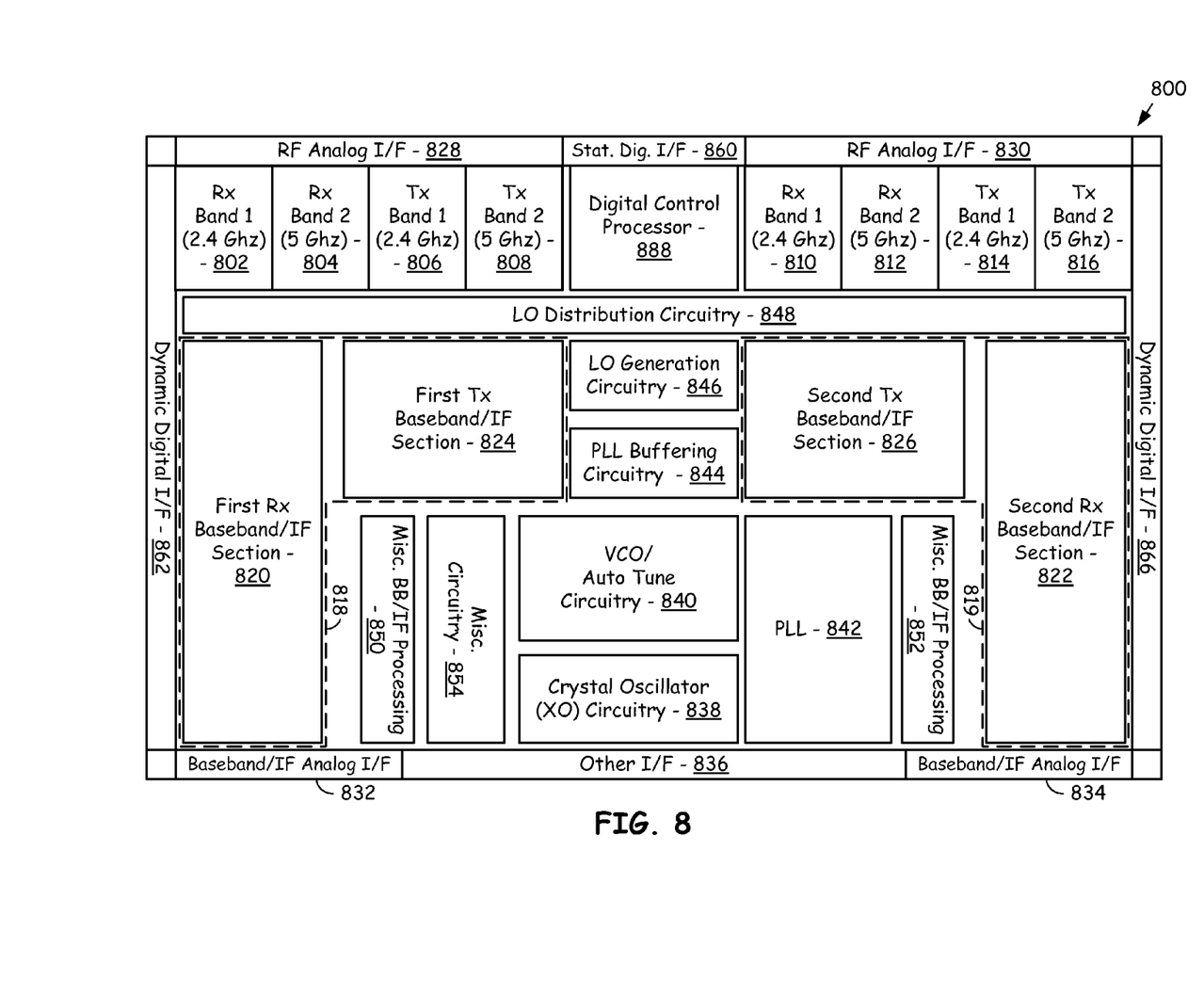
FIG. 8 is a schematic block diagram illustrating a particular embodiment of an RF transceiver IC according to the present invention.

FIG. 8 is a schematic block diagram illustrating a particular embodiment of an RF transceiver IC according to the present invention. The RF transceiver IC 800 of FIG. 8 includes a plurality of baseband Rx sections 820 and 822 operable to receive, filter, and gain adjust respective Rx baseband signals. The RF transceiver IC further includes a plurality of baseband Tx sections 824 and 826 operable to receive, filter, and gain adjust respective Tx baseband signals. The RF transceiver IC 800 further includes a first RF transceiver section and a second RF transceiver section. The first RF transceiver section includes a plurality of RF Tx sections 806 and 808 and a plurality of RF Rx sections 802 and 804. Each of the plurality of RF Tx sections 806 and 808 is operable to receive, filter, gain adjust, and up convert a respective Tx baseband signal to produce a respective Tx RF signal. The plurality of RF Rx sections 802 and 804 each operable to receive, filter, gain adjust, and down convert a respective RF Rx signal to produce a respective Rx baseband signal. Each of the plurality of RF Rx sections 802 and 804 is operable to receive, filter, gain adjust, and down convert a respective Rx RF signal to produce a respective Rx baseband signal. The second RF transceiver section includes a plurality of RF Tx sections 814 and 816 and a plurality of RF Rx sections 810 and 812 that perform corresponding functions. In other embodiments, the first RF transceiver section and second RF transceiver sections may include a differing number of RF Tx sections and RF Rx sections as well as a different ordering and positioning of such sections.

The RF transceiver IC 800 further includes a static digital interface 860 that is operable to receive static gain control commands from a coupled baseband processor. The RF transceiver IC 800 also includes a first dynamic digital interface 862 and a second dynamic digital interface 866. The first dynamic digital interface 862 is operable to receive dynamic gain control commands from a coupled baseband processor for application to the first transceiver section. Further, the second dynamic digital interface 866 is operable to receive dynamic gain control commands from the coupled baseband processor for application to the second transceiver section.

Finally, the RF transceiver IC includes gain control, distribution, and buffering circuitry that is operable to apply the static gain control commands and dynamic gain control commands to at least some of the plurality of baseband Tx sections, the plurality of RF Tx sections, the plurality of RF Rx sections, and the plurality of baseband Rx sections. The gain control, distribution, and buffering circuitry of the RF transceiver IC 800 includes, for example, the digital control processor 888 that couples to the static digital interface 860, miscellaneous baseband processing circuitry 850 that couples to the dynamic digital interface 862, the miscellaneous baseband processing circuitry 852 that couples to the dynamic digital interface 866, and may include various circuitry contained within a first baseband section 818 and a second baseband section 819. The first baseband section 818 includes a first Rx baseband section 820 and a first Tx baseband section 824. The second baseband section includes a second Tx baseband section 826 and a second Rx baseband section 822. The first baseband section 818 couples to baseband interface 832 while the second baseband section 819 couples to baseband interface 834. As the reader will appreciate, the gain control, distribution, and buffering circuitry may be distributed across various portions of the RF transceiver IC 800 to adequately distribute and control the gain adjustable elements of the baseband sections 818 and 819 and the first RF transceiver section and second RF transceiver section.

As the reader will further appreciate, the RF transceiver IC 800 of FIG. 8 is shown with abbreviated detail. Such abbreviated detail does not include the connections between the various elements of the RF transceiver IC 800. Such various connections are readily deducible by the reader from a careful view. Further included in the RF transceiver IC 800 is another interface 836, crystal oscillator circuitry 838, phase locked loop (PLL) 842, VCO/auto tune circuitry 840, PLL buffering circuitry 844, local oscillation generation circuitry 846, and local oscillation distribution circuitry 848. Also included with the RF transceiver IC 800 is miscellaneous circuitry 854. For a more detailed explanation of these various components, refer to co-pending application Ser. No. 11/168,831 entitled RADIO FREQUENCY TRANSCEIVER INTEGRATED CIRCUIT FLOORPLAN, co-pending, filed on even date hereof, and incorporated herein by reference for all purposes.

As one of average skill in the art will appreciate, the term "substantially" or "approximately," as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled." As one of average skill in the art will further appreciate, the term "compares favorably," as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As one of average skill in the art will appreciate, other embodiments may be derived from the teaching of the present invention without deviating from the scope of the claims.

The invention claimed is:

1. A radio frequency (RF) transmitter (Tx), comprising:
a plurality of baseband Tx sections, each operable to receive, filter, and gain adjust a respective Tx baseband signal;
a plurality of RF Tx sections, each operable to receive, filter, gain adjust, and up convert a respective Tx baseband signal to produce a respective Tx RF signal; and
a baseband processor operable to produce static gain control commands corresponding to static gain settings enacted during calibration operations performed at startup or reset and dynamic gain control commands corresponding to dynamic gain settings enacted during non-calibration operations and to provide the static gain control commands and the dynamic gain control commands to at least some of the plurality of baseband Tx sections and the plurality of RF Tx sections.

2. The RF transmitter of claim 1, wherein:
the static gain control commands correspond to static gain settings enacted over multiple RF frame cycles; and
the dynamic gain control commands correspond to dynamic gain settings enacted over an individual RF frame cycle.

3. The RF transmitter of claim 1, further comprising:
gain control circuitry operable to apply the static gain control commands and the dynamic gain control commands to the at least some of the plurality of baseband Tx sections and the plurality of RF Tx sections.

4. The RF transmitter of claim 3, wherein, based upon the static gain control commands, the gain control circuitry is operable to disable the dynamic gain control commands during calibration of the RF transmitter.

5. The RF transmitter of claim 3, wherein:
at least one of the static gain control commands comprises a multiple section selection command; and
the gain control circuitry is operable to apply one dynamic gain control command to multiple baseband Tx sections or multiple RF Tx sections based upon the multiple section selection command.

6. The RF transmitter of claim 3, wherein the dynamic gain control commands comprise:
a section selection command, the gain control circuitry operable to select one of the plurality of baseband Tx sections and the plurality of RF Tx sections based upon the section selection command; and
a section gain control command, the gain control circuitry operable to adjust the gain of at least one adjustable gain element of the selected section based upon the section gain control command.

7. The RF transmitter of claim 3, wherein the dynamic gain control commands comprise:
a section selection command, the gain control circuitry operable to select one of the plurality of baseband Tx sections and the plurality of RF Tx sections based upon the section selection command;
an element selection command, the gain control circuitry operable to select an adjustable gain element of the selected section based upon the element selection command; and
an element gain control command, the gain control circuitry operable to adjust the gain of the selected adjustable gain element of the selected section based upon the element gain control command.

8. A radio frequency (RF) transceiver Integrated Circuit (IC) comprising:
a plurality of baseband Rx sections operable to receive, filter, and gain adjust respective Rx baseband signals;
a plurality of baseband Tx sections operable to receive, filter, and gain adjust respective Tx baseband signals;
a plurality of RF Tx sections, each operable to receive, filter, gain adjust, and up convert a respective Tx baseband signal to produce a respective Tx RF signal;
a plurality of RF Rx sections, each operable to receive, filter, gain adjust, and down convert a respective Rx RF signal to produce a respective Rx baseband signal; and
a baseband processor operable to produce static gain control commands corresponding to static gain settings enacted during calibration operations performed at startup or reset and dynamic gain control commands corresponding to dynamic gain settings enacted during non-calibration operations and to provide the static gain control commands and the dynamic gain control commands to at least some of the plurality of baseband Rx sections, the plurality of baseband Tx sections, the plurality of RF Tx sections and the plurality of RF Rx sections.

9. The RF transceiver IC of claim 8, wherein:
the static gain control commands correspond to static gain settings enacted over multiple RF frame cycles; and
the dynamic gain control commands correspond to dynamic gain settings enacted over an individual RF frame cycle.

10. The RF transceiver IC of claim 8, further comprising:
a first RF transceiver section and a second RF transceiver section, each of the first RF transceiver section and the second RF transceiver section including a respective plurality of RF Tx sections and a respective plurality of RF Rx sections.

11. The RF transceiver IC of claim 10, further comprising:
a static digital interface operable to receive the static gain control commands from the baseband processor, the static digital interface residing adjacent a first edge of the RF transceiver IC;
a first dynamic digital interface operable to receive the dynamic gain control commands from the baseband processor for application to the first RF transceiver section, the first dynamic digital interface residing adjacent a second edge of the RF transceiver IC; and
a second dynamic digital interface operable to receive the dynamic gain control commands from the baseband processor for application to the second RF transceiver section, the second dynamic digital interface residing adjacent a third edge of the RF transceiver IC opposite the second edge of the RF transceiver IC.

12. The RF transceiver IC of claim 8, further comprising:
gain control circuitry operable to apply the static gain control commands and the dynamic gain control commands to the at least some of the plurality of baseband Tx sections, the plurality of RF Tx sections, the plurality of RF Tx sections and the plurality of RF Rx sections.

13. The RF transceiver IC of claim 12, wherein, based upon the static gain control commands, the gain control circuitry is operable to disable dynamic gain control commands during calibration of the RF transceiver IC.

14. The RF transceiver IC of claim 12, wherein:
at least one of the static gain control commands comprises a multiple section selection command; and
the gain control circuitry is operable to apply one dynamic gain control command to multiple baseband Tx sections, multiple RF Tx sections, multiple RF Rx sections, or multiple baseband Rx sections based upon the multiple section selection command.

15. The RF transceiver IC of claim 12, wherein the dynamic gain control commands comprise:
a section selection command, the gain control circuitry operable to select one of the plurality of baseband Tx sections, the plurality of RF Tx sections, the plurality of RF Rx sections, and the plurality of baseband Rx sections based upon the section selection command; and
a section gain control command, the gain control circuitry operable to adjust the gain of at least one adjustable gain element of the selected section based upon the section gain control command.

16. A method for adjusting the gain of gain adjustable elements of an RF transmitter (Rx) having a plurality of baseband Tx sections and a plurality of RF Tx sections, comprising:
receiving static gain control commands from a baseband processor during calibration operations performed at startup or reset;
receiving dynamic gain control commands from the baseband processor during non-calibration operations of the plurality of baseband Tx sections and the plurality of RF Tx sections;
applying the static gain control commands to at least some gain adjustable elements of the plurality of baseband Tx sections and the plurality of RF Tx sections; and
applying the dynamic gain control commands to at least some gain adjustable elements of the plurality of baseband Tx sections and the plurality of RF Tx sections.

17. The method of claim 16, further comprising:
enacting the static gain control commands over multiple RF frame cycles; and
enacting the dynamic gain control commands over respective individual RF frame cycles.

18. The method of claim 16, further comprising:
enacting the static gain control commands during calibration operations; and
disabling the dynamic gain control commands during the calibration operations.

19. The method of claim 16, wherein:
applying the static gain control commands comprises selecting multiple sections of the plurality of baseband Tx sections and the plurality of RF Tx sections based upon the static gain control commands; and
applying the dynamic gain control command comprises adjusting the gain of gain adjustable elements of the selected multiple selections.

20. The method of claim 16, wherein:
applying the dynamic gain control command comprises selecting a section of the plurality of baseband Tx sections and the plurality of RF Tx sections based upon the dynamic gain control command; and
applying the dynamic gain control command further comprises adjusting the gain of gain adjustable elements of the selected section.

21. The method of claim 16, wherein:
applying the dynamic gain control command comprises selecting a section of the plurality of baseband Tx sections and the plurality of RF Tx sections;
applying the dynamic gain control command further comprises selecting a gain adjustable element of the selected section; and
applying the dynamic gain control command further comprises adjusting the gain of the selected gain adjustable element of the selected section.

* * * * *